United States Patent [19]
Hiraishi et al.

[11] Patent Number: 5,502,820
[45] Date of Patent: Mar. 26, 1996

[54] MICROPROCESSOR HAVING HIGH SPEED, LOW NOISE OUTPUT BUFFERS

[75] Inventors: Atsushi Hiraishi, Oume; Takashi Akioka, Hitachi; Yutaka Kobayashi, Katsuta; Yuji Yokoyama, Hitachi; Masahiro Iwamura, Hitachi; Tatsumi Yamauchi, Hitachi; Shigeru Takahashi, Hitachiohta; Hideaki Uchida; Akira Ide, both of Takasaki, all of Japan

[73] Assignee: Hitachi, Ltd., Tokyo, Japan

[21] Appl. No.: 385,656

[22] Filed: Feb. 8, 1995

Related U.S. Application Data

[62] Division of Ser. No. 608,370, Nov. 2, 1990, Pat. No. 5,398,318.

[30] Foreign Application Priority Data

Nov. 2, 1989 [JP] Japan .................................. 1-284731

[51] Int. Cl.⁶ .......................... H03K 17/16; G06F 13/00
[52] U.S. Cl. ........................... 395/250; 326/82; 327/108; 395/800
[58] Field of Search .................................. 326/82, 83, 89; 327/108; 395/250, 800

[56] References Cited

U.S. PATENT DOCUMENTS

| | | | |
|---|---|---|---|
| 3,987,418 | 10/1976 | Buchanan | 395/800 |
| 4,468,753 | 8/1984 | Berger | 395/775 |
| 4,642,486 | 2/1987 | Honma et al. | 326/105 |
| 4,992,677 | 2/1991 | Ishibashi et al. | 326/27 |
| 5,089,722 | 2/1992 | Amedeo | 326/87 |

Primary Examiner—Parshotam S. Lall
Assistant Examiner—Viet Vu
Attorney, Agent, or Firm—Antonelli, Terry, Stout & Kraus

[57] ABSTRACT

An improved buffer circuit arrangement is provided which is particularly useful for semiconductor integrated circuit semiconductor memories and microprocessors. The buffer circuit is capable of switching large loads in various types of LSIs, and features a low noise and high speed circuit operation. This is accomplished by a parallel connection of output transistors in an output buffer circuit, and by differentiating the starting time of operation between the output transistors connected in parallel without using a delay circuit. For example, differentiating the starting times can be achieved by either providing the transistors with different characteristics from one another or the driving circuits with different characteristics from one another. Another aspect of the circuit is the provision of a two-level preset arrangement which presets the output node of the circuit to predetermined values before the input signals are applied.

28 Claims, 13 Drawing Sheets

$t_0$ — START TIME OF DRIVING OPERATION $t_1$ — START TIME OF DRIVING OPERATION FOR OUTPUT Tr $M_3$ $t_2$ — START TIME OF DRIVING OPERATION FOR OUTPUT Tr $M_4$ OR $M_2$ $t_3$ — START TIME OF DRIVING OPERATION FOR OUTPUT Tr M68 (OF FIG. 1)

DOC...HIGH IMPEDENCE OUTPUT SIGNAL CABLE

DOC...HIGH IMPEDENCE OUTPUT SIGNAL CABLE
ATD...ADDRESS TRANSITION DETECTION SIGNAL CABLE

MICROPROCESSOR HAVING HIGH SPEED, LOW NOISE OUTPUT BUFFERS

This is a divisional of application Ser. No. 608,370, filed Nov. 2, 1990, now U.S. Pat. No. 5,398,318.

BACKGROUND OF THE INVENTION

The present invention relates to semiconductor integrated circuits, including semiconductor memory devices and microprocessors, and particularly to their output buffer circuits.

With regard to the operation of conventional output buffer circuitry in semiconductor integrated circuit devices, switching noise has become a serious problem. The cause of this problem is the occurrence of a transient abrupt fluctuation in current due to rapid charging and discharging of a large capacity external load. Generally, a final stage output transistor in an output buffer circuit is designed to satisfy a particular specification for $I_{OH}$ (high level output current) or $I_{OL}$ (low level output current), so a relatively large capacity output transistor is used. Such a large capacity output transistor provided with a large driving capacity, once it starts its operation, tends to bring about a large current fluctuation because of its extremely large current increase rate in a time elapsed, thereby becoming a large noise source. Further, when an output transistor becomes larger in capacity, in particular, in the case of a MOS transistor, its gate input capacitance will increase, and in the case of a bipolar transistor, its capacitance between the base and emitter will increase. Therefore, the time lag from the start of a driving operation in the driver section to the start of a driving operation in the output transistor becomes greater, which causes an increase in the delay time. Therefore, in order to obtain a high speed and low noise output buffer circuit, it is necessary to control a driving state in such an output transistor.

As a means for controlling the driving state of output transistors in the prior art, a parallel connection of one set of output transistors has been provided, with their driving operation lagging the other output transistors in time by using a delay circuit, as discussed in Japanese Patent Laid-Open No. 62-220026 (1987).

An example of the above prior art technology is shown in FIG. 1. One of the problems associated with this prior art technology is that because output transistors (M57 and M68) connected to driving circuits (I7 and I10) provided with delay circuits (D1 and D2) inevitably are delayed in the start of their driving operation, it is difficult to increase the speed of operation in the buffer circuits. Another problem arising from such an arrangement to set on a non-conduction state all at once in the output transistors (M57 and M58 or M67 and M68) connected in parallel is that insufficient consideration has been given to the fact that there occurs an abrupt decrease in current, because of a rapid transition from the on-state to the off-state in the output transistors, thus causing a greater noise.

SUMMARY OF THE INVENTION

One of the objects of the present invention is to provide a semiconductor integrated circuit to be employed as a buffer circuit in various types of LSIs, featuring a low noise and high speed circuit operation.

Another object of the present invention is to provide a semiconductor memory of a microprocessor incorporating the above semiconductor integrated circuit.

The first object has been accomplished by a parallel connection of output transistors in an output buffer circuit, and by differentiating the starting time of operation between the output transistors connected in parallel without using a delay circuit.

The second object of the invention has been accomplished by applying the above output buffer circuit to a semiconductor memory or to a microprocessor.

As an effective means for solving the above problems, it is assumed that no delay circuit or no equivalent means should be used. With reference to FIG. 2, an example of a parallel circuit contemplated to achieve this effect will be explained. By making a total signal transmission pass or time from a driving circuit A in the driving circuit through one side of parallel transistors (more specifically, M1 and M3) shorter than a total signal transmission pass or time from another driving circuit B through another side of the parallel transistors (more specifically, M2 and M4), it has been proved effective to differentiate the starting time of activation between parallel connected output transistors. For example, the transistors M1 and M3 can be made to have different characteristics than the transistors M2 and M4 so that the load on driving circuit A is different than that on driving circuit B. On the other hand, the driving capabilities of the driving circuits A and B can be made different from one another to accomplish the same result of differentiating starting time without the need of a delay circuit such as used in the prior art.

By such arrangements, parallel connected output transistors are driven differentially not only in their starting but also in their stopping operation, thereby reducing the chance of an abrupt change in a transient current. This solves the problem of switching noise, and also enhances the speed of operation in the output buffer circuit.

In other words, one of the advantages of the present invention is that there has been provided a novel output buffer circuit comprising, on the one hand, an output buffer circuit capable of operating at a higher speed than average buffer circuits, which higher speed is realized by partially restraining a performance characteristic other than its signal transmission time, and, on the other hand, an ordinary buffer circuit connected in parallel with the above. Another advantage is that, by applying the output buffer circuit thus obtained to semiconductor integrated circuit devices such as microprocessors or the like, there will be provided a high speed low noise semiconductor integrated circuit equipment. The advantages and effects described above and other advantages and effects should be more clearly understood by the following descriptions.

DESCRIPTION OF THE PREFERRED EMBODIMENTS

An exemplary embodiment according to the present invention will be explained with reference to FIG. 2.

Figure 2:
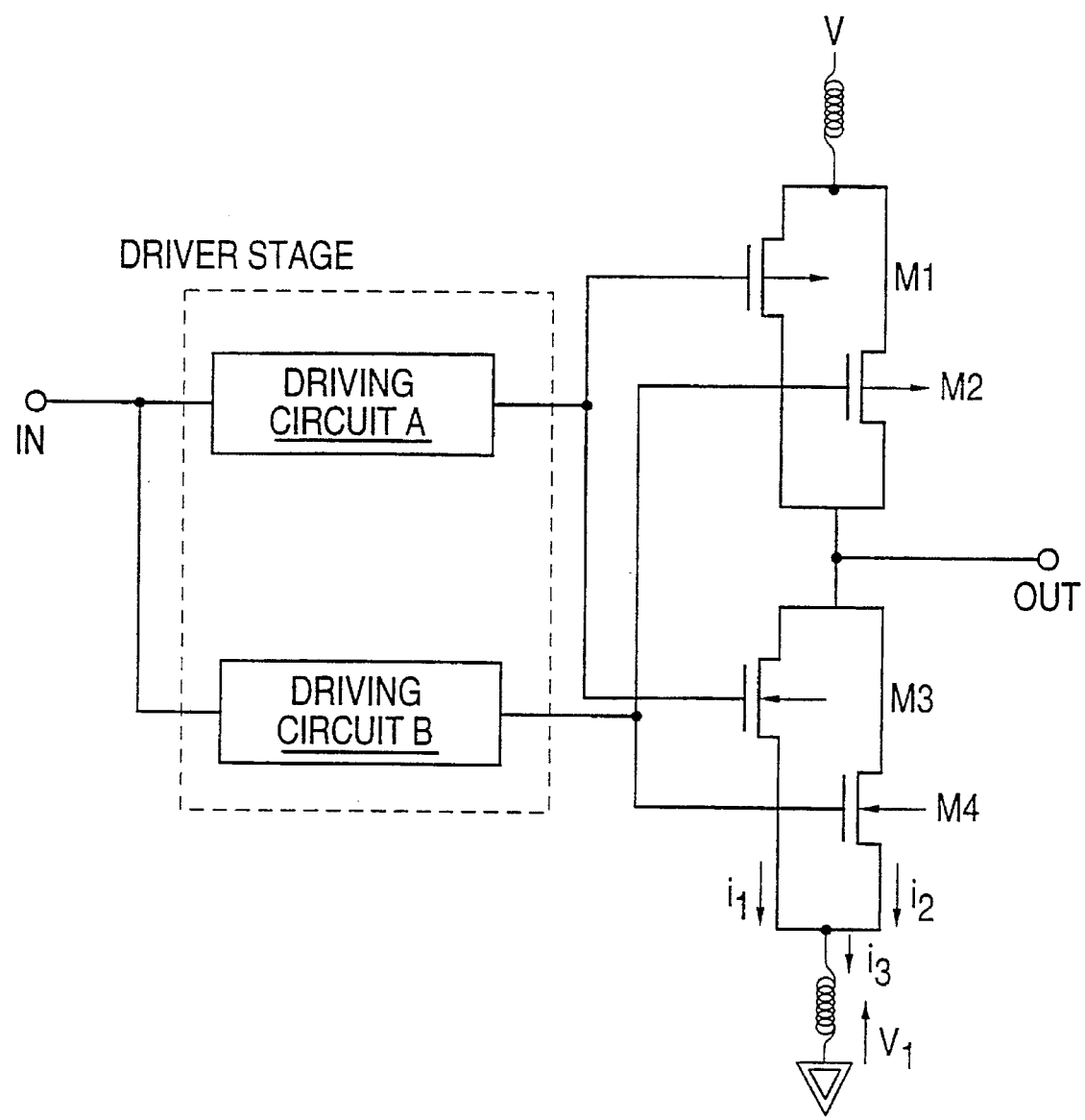
FIG. 2 shows one embodiment of the present invention, i.e., an output buffer circuit.

In the embodiment circuit in FIG. 2, there is shown an output buffer circuit composed of two buffer circuits connected in parallel; one comprising a driving circuit A in the driver section and output transistors M1 and M3; the other one comprising another driving circuit B in the driver section and output transistors M2 and M4. Further, one common joining node for the output transistors M1 and M2 is connected to a power supply V, the other common joining node on the opposite side is connected both to the output OUT and to a common joining node for output transistors M3 and M4. The other common joining node for the output transistors M3 and M4 on the opposite side is connected to the ground. Still further, an input signal from the internal circuit at the input IN is shunted and provided to the driving circuits A and B.

The functions of the output buffer circuit in FIG. 2 are explained in the following. The driving circuits A and B in this embodiment are the same in their performance, while the transistors have the following relationship in their respective sizes (some specific examples of which will be discussed later):

M1<M2, M3<M4

Figure 1:
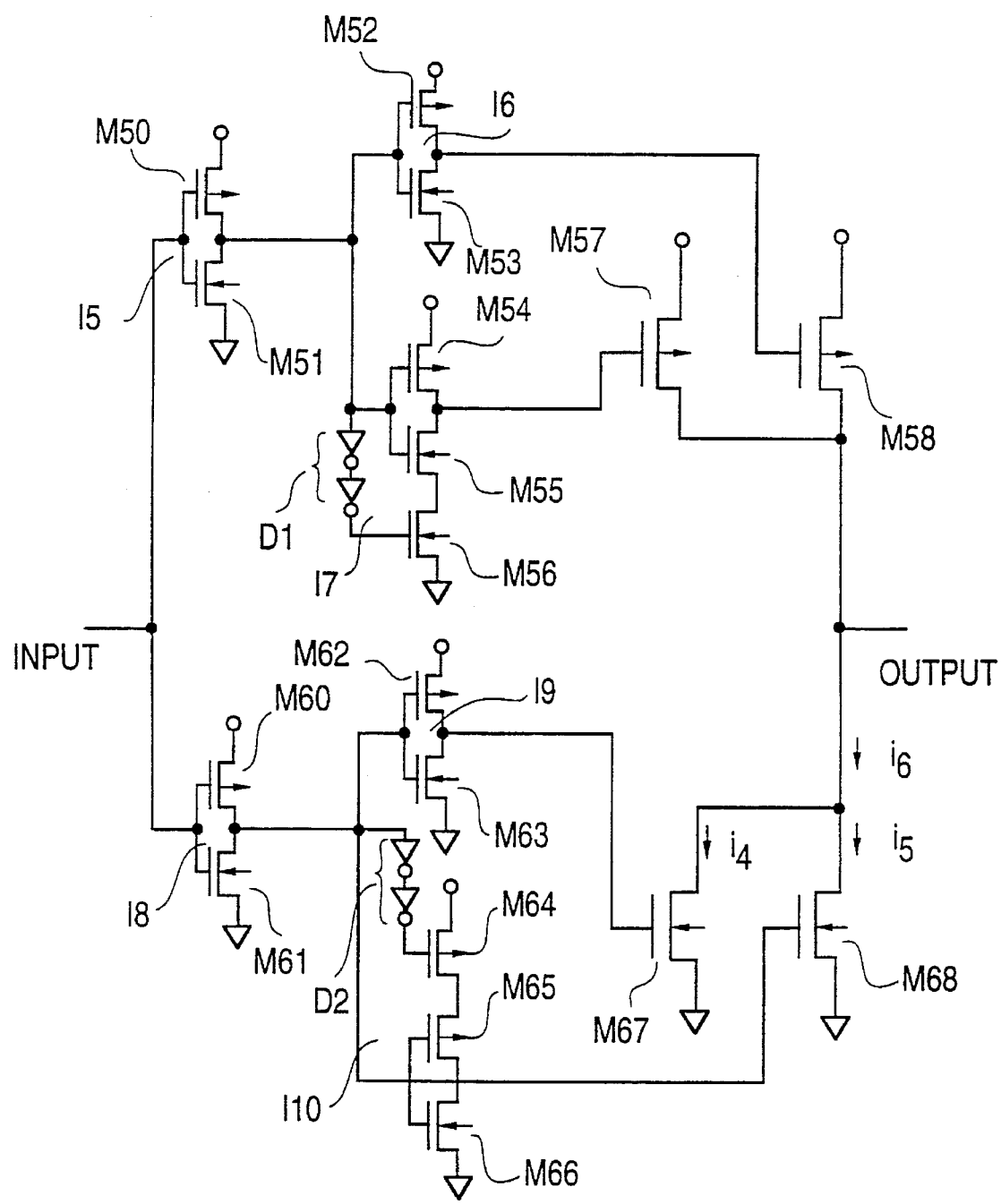
FIG. 1 is a block diagram showing a CMOS level output buffer circuit according to the prior art.
Figure 3A:
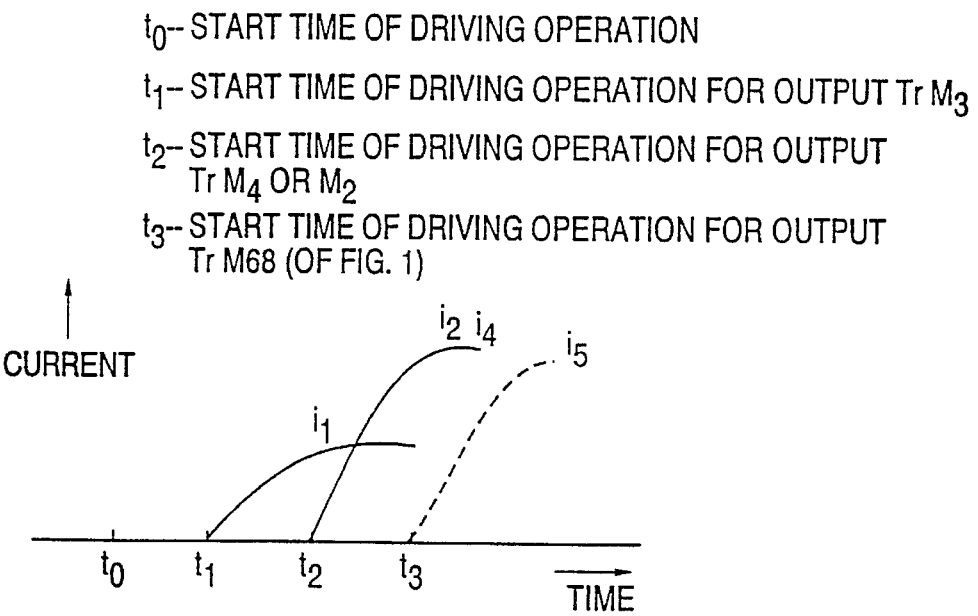
FIGS. 3(a) to 3(c) show the waveforms of the output transistors' currents and the ground noise for explaining their functions.
Figure 3B:
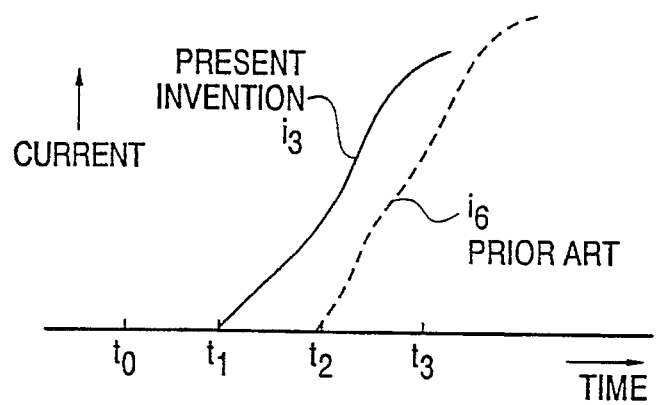
Figure 3C:
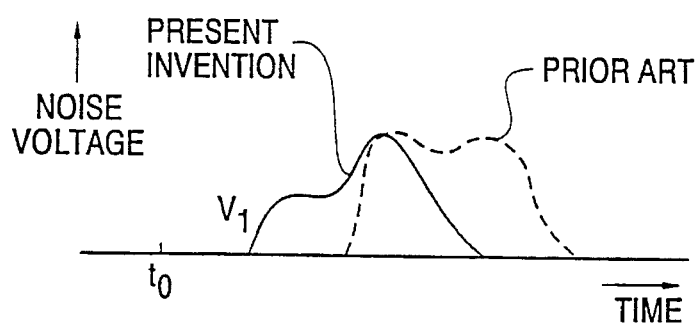

Here, let us consider the transition sequence from "High" to "Low" output. The driving circuits A and B start their operation at the same time $t_O$ activated by an input signal from the internal circuit through the input terminal IN. When comparing M3 with M4 as to the respective size of transistors, because M3 is smaller than M4, the time required for charging their respective gate capacitance differs. If the time for starting a driving operation for each output transistor is set to be $t_1$ and $t_2$, respectively, there is accordingly derived a relationship that $t_1<t_2$. Therefore, the currents $i_1$ and $i_2$ flowing through each output transistor will be such as shown in FIGS. 3(a) and 3(b). At first, the smaller output transistor M3 starts its driving operation. Because this output transistor M3 is contemplated to operate in advance by sacrificing its driving force, its current driving capability is small and it tends to become saturated at a small value of current. On the other hand, the output transistor M4, although its driving start time lags that of M3, because of its higher driving force, tends to show no saturation until a rather higher value of current. Thereby, a total current curve from the output transistors according to the present invention will be such as shown as I3, in FIG. 3(b). This total current curve, when compared with current $i_6$ obtained by adding $i_4$ and $i_5$ flowing through the output transistors of the prior art technology shown in FIG. 1, is found to have a starting time of its driving operation preceding that of the prior art arrangement. Further, noise voltages across inductance on the ground side, generated by currents $i_3$ flowing through the output transistor of the present invention and $i_6$ flowing through the output transistor in FIG. 1 according to the prior art, are proportional to L di/dt, so that there is little chance for the noise voltages to exceed the conventional level as shown in FIG. 3(c). As described above, one of the parallel connected output transistors plays a role to start in advance in its driving operation, and the other one plays a role to increase its amplitude of a total current obtainable.

As described above, this embodiment of the present invention provides a novel output buffer circuit capable of achieving a high speed switching operation while ensuring a low noise property. In effect, this is based on the different characteristics between the transistors coupled to driving circuit A from those coupled to driving circuit B.

Another embodiment according to the present invention will be described in the following with reference to FIG. 4. This other embodiment is an output buffer circuit which puts out a TTL level output responding to a differential small signal input, and has a tri-state output high impedance function. Here, transistors M10 through M16, M22 through M24, and M30 are p-channel MOSFETs, respectively. Transistors M17 through M21, M25 through M29, and M31 through M33 are n-channel MOSFETs. Transistors Q1 through Q4 are composed of npn bipolar transistors. They are connected in such relations as follows.

An input signal is put into node a and node b, respectively. Node a thereof is connected to the drain of M10 and the gates of M12, M23, and M24. Node b is connected to the drain of M11 and the gates of M22, M13, M14 and M16. Node c is connected to the drains of M12 and M17, and to the gates of M17, M18 and M19. Node d is connected to the drains of M13, M18, M16 and M21, and to the base of Q2. Node e is connected to the drains of M14, M19 and M20, and to the base of Q3. Node f is connected to the sources of M18 to M21 inclusive, to the gate and source of M15, and to the base and collector of Q1. Node g is connected to the drains of M22 and M25, and to the gates of M25, M26 and M27. Node h is connected to the drains of M23, M26 and M29, and to the gate of M32. Node i is connected to the drains of M24, M27 and M28, and to the gate of M33. Node j is connected to the emitters of Q2 and Q3, and to the collector and base of Q4. Node k is connected to the emitter of Q4, and to the drains of M32 and M33, from which node the signal is outputted. A node DOC is a signal input node for an output high impedance cable, and is connected to the gates of M10, M11, M30 and M31. Node $\overline{DOC}$ is connected to the drains of M30 and M31, and to the gates of M20, M21, M28 and M29. The sources of M10 through M15, M22 through M24, and M30 are connected to the power supply node VA. The source of M16 and the collectors of Q2 and Q3 are connected to the power supply node VB. The sources of M17, M25 through M27 and M31, and the emitter of Q1 are connected to the ground node GA. The sources of M28, M29, M32 and M33 are connected to the ground node GB.

Figure 4:
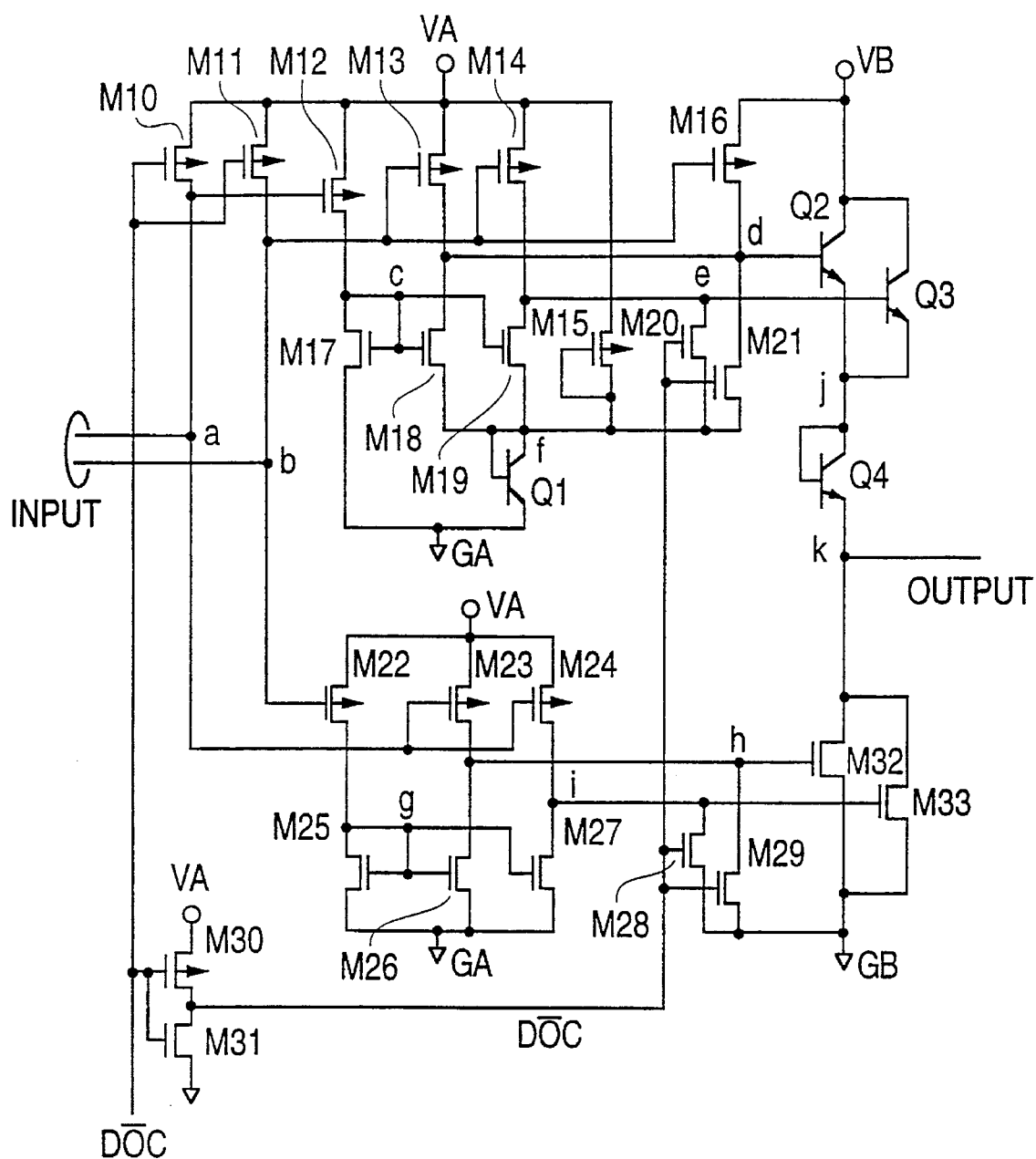
FIG. 4 is another embodiment of the present invention, i.e., a TTL output buffer circuit.
Figure 5:
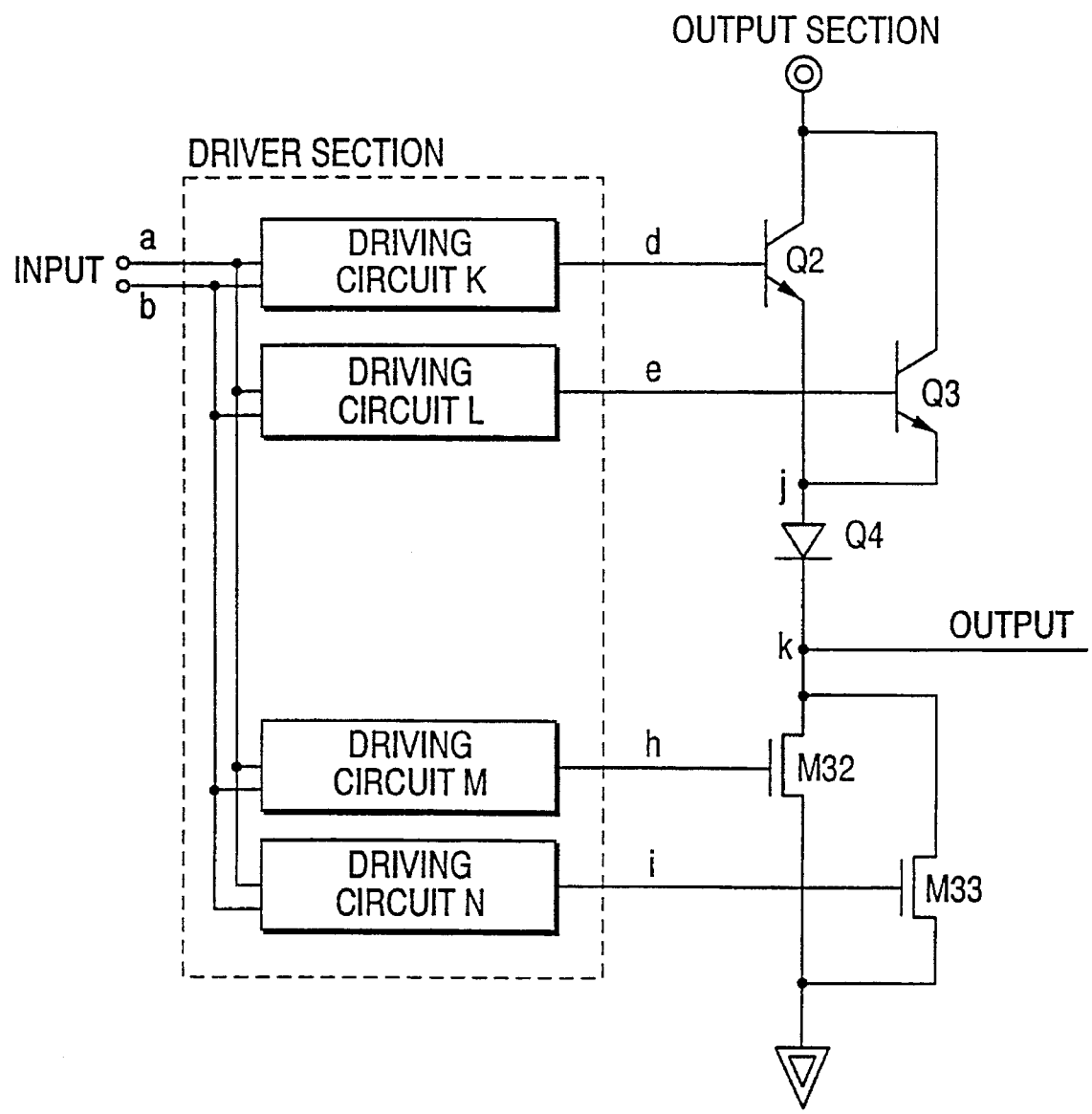
FIG. 5 is a simplified version of FIG. 4.

The above explained circuitry is further simplified in FIG. 5 to make it easier to understand its concept. A driving circuit K in FIG. 5 corresponds to a portion in FIG. 4 comprising M12, M13, M15, M16, M17, M18 and Q1. In the same way, a driving circuit L corresponds to a portion comprising M12, M14, M15, M17, M19 and Q1, wherein M12, M17 and Q1 are for common use. A driving circuit M corresponds to a portion in FIG. 4 comprising M22, M23, M25 and M26. A driving circuit N corresponds to a portion comprising M22, M24, M25 and M27. In the above M and N driving circuits, M22 and M25 are for common use.

Figure 6:
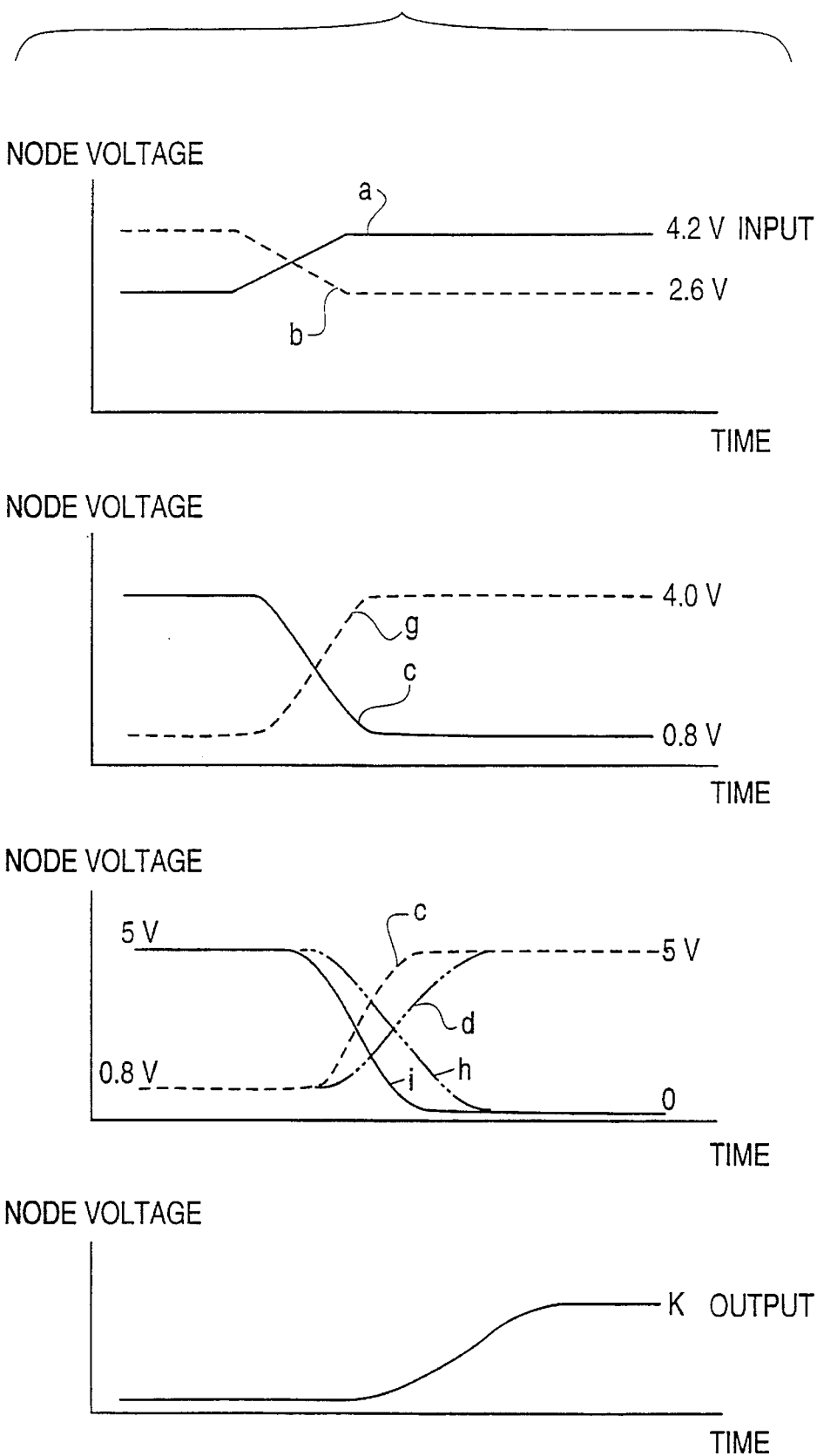
FIG. 6 shows voltage waveforms at each node in FIG. 4 when the output changes from "Low" to "High"

The function of this embodiment circuitry is explained in the following. As a first step, voltages of 5 V are applied to the power supply nodes VA and VB, and also to the node DOC, thereby turning off M10 and M11. As a result, a signal $\overline{\text{DOC}}$ outputted from an inverter comprising M30 and M32 becomes 0 V, consequently turning off all of M20, M21, M28 and M29, and thereby setting the output buffer circuit in an active state. Here, if we suppose that an "L" level signal of 2.6 V is applied to the node a, and a "H" level signal of 4.2 V is applied to the node b, then M12, M23 and M24 become on-state, while M13, M14, M16 and M22 become off-state. Further, because M12 is on-state, a current flows from the node c to the node GA through the diode-connected M17. The voltage at the node c is increased to about 4 V, thereby M18 and M19 become on-state, thus decreasing the base voltages of Q2 and Q3 to about 0.8 V or turning off Q2 and Q3. On the other hand, the voltage at the node g decreases to about 0.8 V because M22 is off-state, thereby turning off M26 and M27. Further, because M23 and M27 are on-state, the voltages at the nodes k and i are increased to about 5 V, thereby turning on the output MOS transistors M32 and M33. Consequently, the output node k puts out an "L" level output near 0 V. If we presume that the node a is changed from 2.6 V to 4.2 V, and the node b is changed from 4.2 V to 2.6 V respectively, on/off states of M12 and M22 will be reversed, and also the voltages of the node c and the node g will be reversed. Further, on/off-states of M13, M14 and M16, and those of M23 and M24 will be reversed, thereby the voltages at the nodes d and e being reversed with the voltages at the nodes h and i. Along with these reversals, M32 and M33, move more toward the off-state, while Q2 and Q3, move more toward the on-state. As a consequence, the output node k gradually moves toward "H" level. The states of change in the node voltages are shown in FIG. 6. The states of changes to be noted here are of the voltages of the nodes d, e, h, and i. The node e starts rising in voltage faster than the node d, and its voltage change is steep. Also, the node i starts to fall in voltage faster than the node h, and its voltage change is steep.

As a means for differentiating driving timing of such output devices connected in parallel as described above, there is a means to reduce the sizes of Q3 and M33 more than those of Q2 and M32, more specifically to reduce an emitter area in case of Q3, and a gate width in case of M33. Thereby, relatively small-sized transistors Q3 and M33 thus obtained are capable of operating at a higher speed with their parasitic capacitance being reduced substantially, thus providing a differential driving timing between the output devices.

In addition, referring to FIG. 5, by increasing the driving forces in the driving circuit L and the driving circuit N, Q3 and M33 can be made to operate faster. This modification corresponds to increasing the width of the MOS gates of M14 and M24 in FIG. 4.

Another means for this effect is to reduce the thickness of the base of the bipolar transistor Q3 or the thickness of its epitaxial layer so as to enhance the performance of Q3. Further, in MOS transistor M33, its performance is improved by reducing the thickness of the gate oxide film or by shortening its gate length, or by lowering its threshold voltage and the like. Through these means, as in the above arrangements, i.e., by adopting the process device means to each transistor, it can be improved substantially in performance. Thereby, the speeds of operation of Q3 and M33 have been enhanced, thus, effecting to differentiate the starting time of the driving operation between the output devices Q2 and Q3 connected in parallel, or between M32 and M33 connected alike.

This embodiment circuit is characterized in that any of the above-mentioned means can be applied thereto. Further it has also such advantages as will be described below. M16 connected to the power supply VB on the output device side through its source is characterized by decreasing its driving force in accordance with the decrease in VB occurring due to the noise by the transient currents at Q2 and Q3. The decrease in its driving force is effected by means of a feedback of the noise caused by the transient currents.

The next embodiment according to the present invention is shown in FIG. 7($a$), which circuitry is composed by adding two level preset circuits to the circuitry in FIGS. 4 and 5. A block diagram explaining this embodiment circuitry is shown in FIG. 7($b$). The two level preset circuits consists of a level 1 generation circuit and a level 2 generation circuit, connected to the output terminal node k. With reference to FIGS. 7($a$) and 7($b$), a portion including M38 through M41, QS, Q6, R71 and R72 functions as the level 1 generation circuit to increase the voltage at the output terminal node k up to a level 1 voltage (e.g., 0.8 V) when the voltage at the output terminal node k is at a "Low" voltage (e.g., 0.4 V). Another portion including M42, M43, Q7, QS, and R73 through R75 functions as the level 2 generation circuit to decrease the voltage at the output terminal node k down to a level 2 voltage (e.g., 2.2 V) when the voltage at the output terminal node k is at a "High" voltage (e.g. 2.4 V). The functions of this embodiment circuitry when inputted with input signals a and b, an address transition detection signal (ATD) and a DOC signal as shown in FIG. 7($c$), will be explained below.

At first, the signal input nodes a and b are pulled up toward the high voltage by the inputted DOC signal, while the driving circuit nodes d, e, h and i are pulled down to the low voltage, thereby the output buffer circuit moves toward an inactive state. The DOC signal is provided with the minimum pulse width necessary to inactivate the output buffer circuit. Successively, the ATD signal is inputted, by which the two level preset circuitry is activated, wherein the level 1 generation circuit or the level 2 generation circuit according to the voltage at the output terminal node k starts its driving operation. In case the output terminal node k is in a "Low" level near 0 volt, the level 1 generation circuit selectively starts its operation, flowing a current $i_7$ through transistor Q5. The operation of the two-level preset circuitry, however, is limited to a certain period of time, and when the DOC signal turns "High", the driving circuits K through N are activated (see FIG. 7($b$) corresponding to the driving circuits of FIG. 5),starting their driving operation according to the input signals appearing at the signal input nodes a and b.

When the input signal appearing at the nodes a and b changes as shown in FIG. 7($c$), transistor Q3, which has a relatively small area for its emitter to provide a small parasitic capacitance, starts its driving operation at first, flowing a current $i_8$. The current of this transistor Q3, however, is soon saturated because of the limited area of its emitter, and because its maximum current density is insufficient. Next, the output transistor Q2 having a larger emitter area starts its driving operation, producing current $i_9$. Likewise, in this embodiment, a smoothed current increase such as shown in FIG. 7($c$) as $i_{10}$ is provided, representing a total current waveform which has been obtained by arranging Q5, Q3 and Q2 in the circuitry so as to put out their currents in succession one after another. In addition, a further advantage of this embodiment is that before the input signal is switched on, current begins to flow gradually and continues to increase. Still another advantage is that because the output buffer circuit passes through an inactive state before the input signal is switched on, all the output transistors pass through an off-state once, before they are driven selectively according to the inputted signals. By such arrangements, a through current occurring due to a coexistence of a transistor changing from the on-state to the off-state and another transistor changing from the off-state to the on-state can be prevented.

Figure 11:
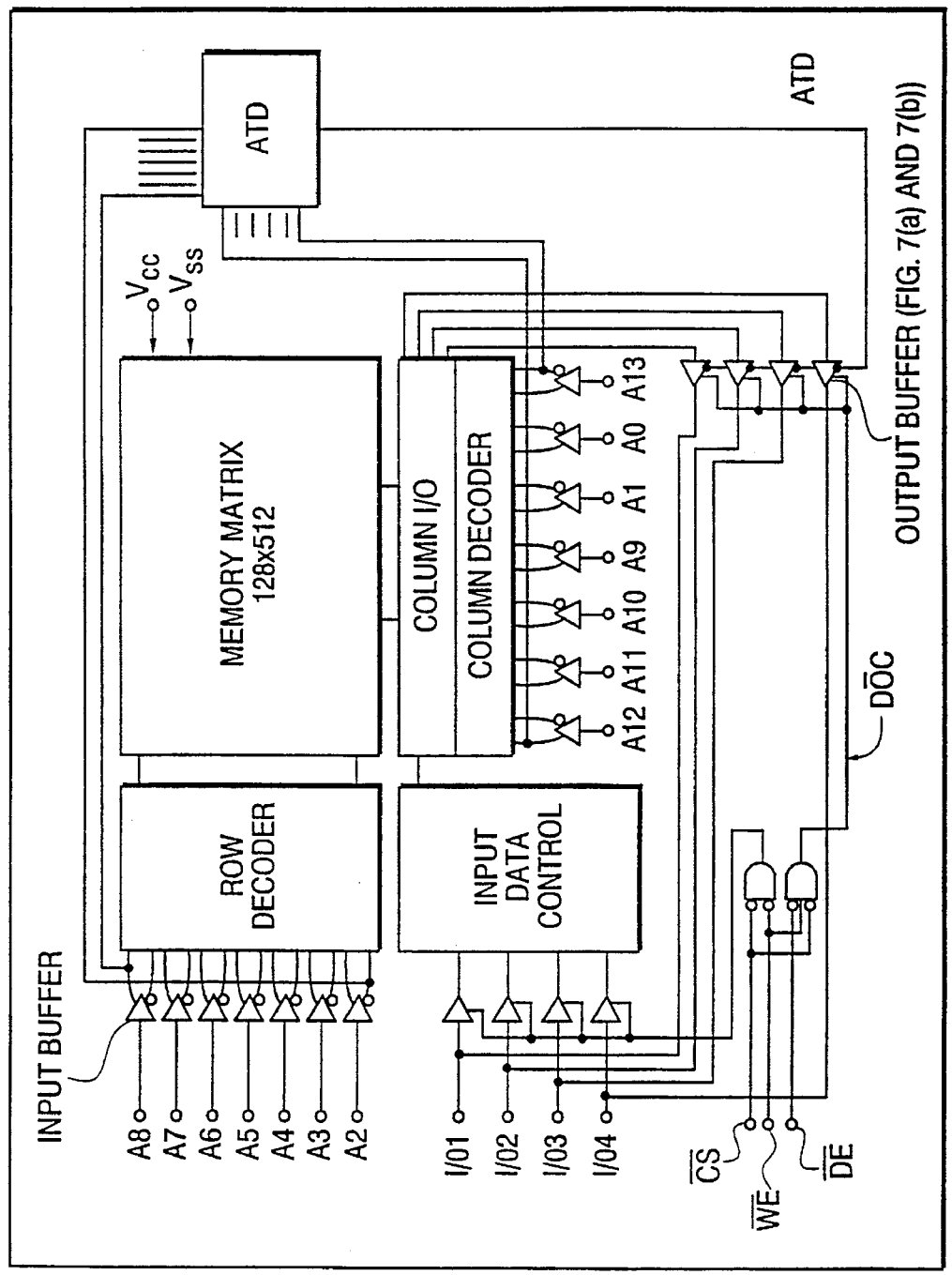
FIG. 11 shows a circuit to generate control signals for the output buffer shown in FIGS. 7(a) and 7(b).

The ATD signal employed in this embodiment is a signal for detecting the transition of the address signal, part of which detected signal of the transition in the address signal is inputted to the DOC signal so as to maintain logical sequence or compatibility. FIG. 11 shows an example of a circuit for generating the signals ATD and DOC. The output buffers shown in FIG. 11 can correspond to that shown in FIGS. 7(a) and 7(b). As shown in FIG. 11, the ATD signal is generated by an address transition detector ATD. This circuit ATD monitors changes in the address signal by monitoring the output of the input buffers coupled between the input address signals and the row decoder. The DOC signal is generated as a logic output based on the input levels of the chip select signal $\overline{CS}$, the write enable signal $\overline{WE}$ and the operation enable signal $\overline{OE}$. These control signals ATD and DOC are applied to the output buffers to provide the control discussed above for FIGS. 7(a) and 7(b).

Figure 8:
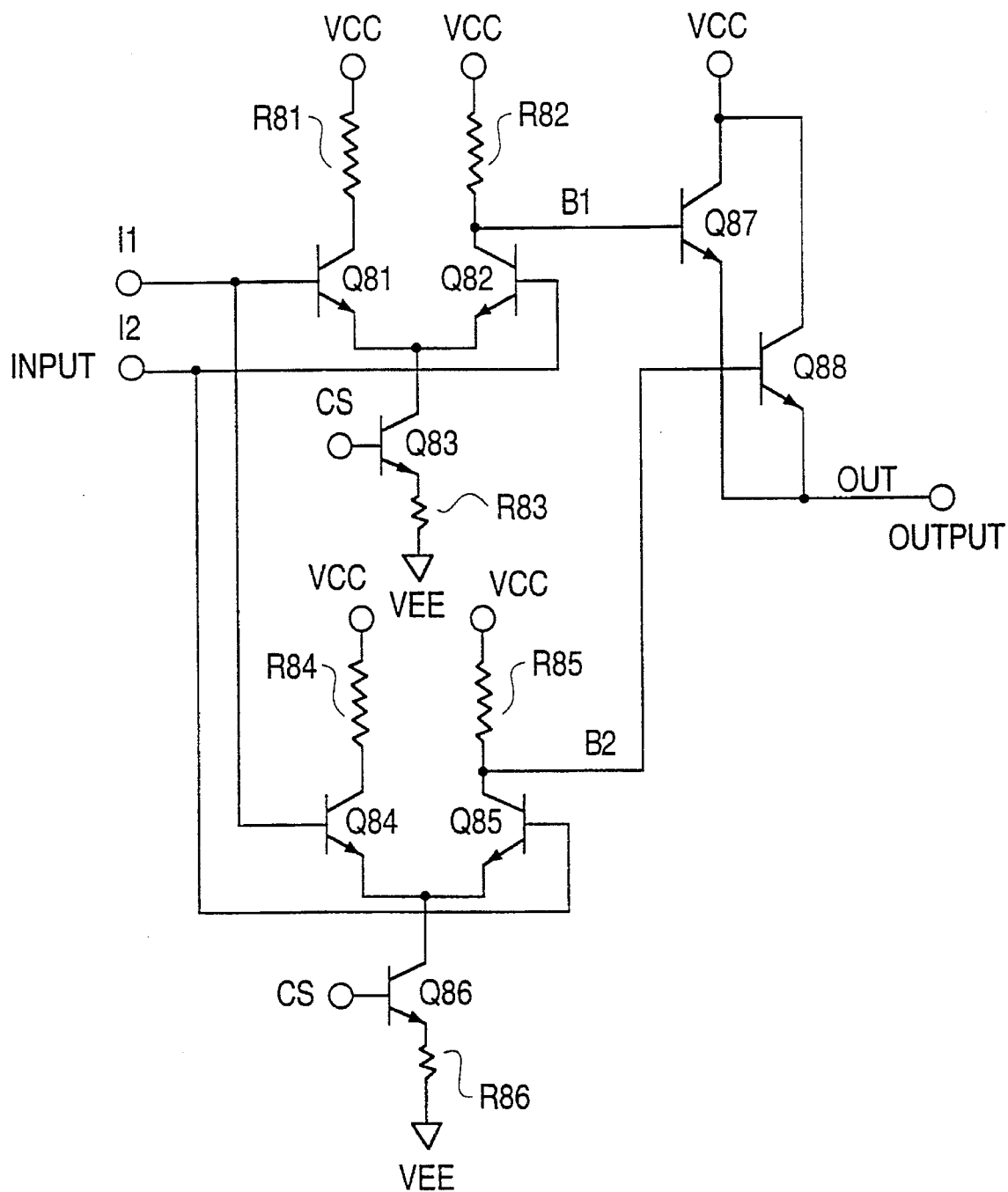
FIG. 8 is still another embodiment circuit of the present invention.

Furthermore, FIG. 8 shows still another embodiment of the present invention, when it is applied to an output buffer circuit of an ECL logic level. Numerals Q81 through Q88 denote npn bipolar transistors, while numerals RS1 through R86 denote resistors. They are connected as follows. The bases of Q81 and Q84 are connected to an input node I1, and their collectors are connected to first ends of the resistors RS1 and R84, respectively. The other ends of the resistors RS1 and R84 are connected to a power supply node Vcc. The bases of transistors Q82 and Q85 are connected to an input node I2, while their collectors are connected to first ends (nodes B1 and B2) of the resistors R82 and R85, respectively. The other ends of the resistors R82 and R85 are connected to a power supply node Vcc. Transistors Q81 and Q82 are connected to each other at their emitters, which are further connected to the collector Of Q83. Transistors Q84 and Q85 are connected to each other at their emitters, which are further connected with the collector of Q86. The bases of Q83 and Q86 are connected to a node CS, and their emitters are connected to the power supply node $V_{EE}$ through resistors R83 and R86, respectively. The collectors of Q87 and Q88 are connected to a power supply node Vcc, and their emitters are connected to the output terminal node OUT. The bases of Q87 and Q88 are connected to a node B1 and a node B2, respectively. It is presumed in this circuitry that a portion including transistors Q81 through Q83 and resistors RS1 through R83 constitutes a part of a driving circuit using differential amplifiers, and another portion including transistors Q84 through Q86 and resistors R84 through R86 constitutes the other part of the driving circuit using differential amplifiers. Q87 and Q88 are output transistors connected in parallel.

The present invention can also be applied to this ECL output buffer circuit. For example, by reducing the emitter area of Q87 to about one fifth of that of Q88 so as to reduce capacitance between the emitter and base of Q87, the start of operation for the output transistor Q87 can be advanced so that a low noise and high speed operation are achieved. As a modified embodiment, it is contemplated that the same effect may be achieved by reducing the values of resistors RS1 and R82 by half and at the same time by enlarging the emitter area of transistor Q83 to be twice as large as that of the other transistors. Through such configurations, the start of operation of Q87 can be advanced with its signal amplitude kept constant, differentiated in the time of start of operation from that of transistor Q88, so that a low noise and high speed circuit are provided. It is also effective to enhance the high frequency properties of Q81, Q82 and Q87 as another modified means.

This output buffer circuit, i.e., a semiconductor integrated circuit according to the present invention, is also applicable to a semiconductor memory and a microprocessor, and the like.

Figure 7A:
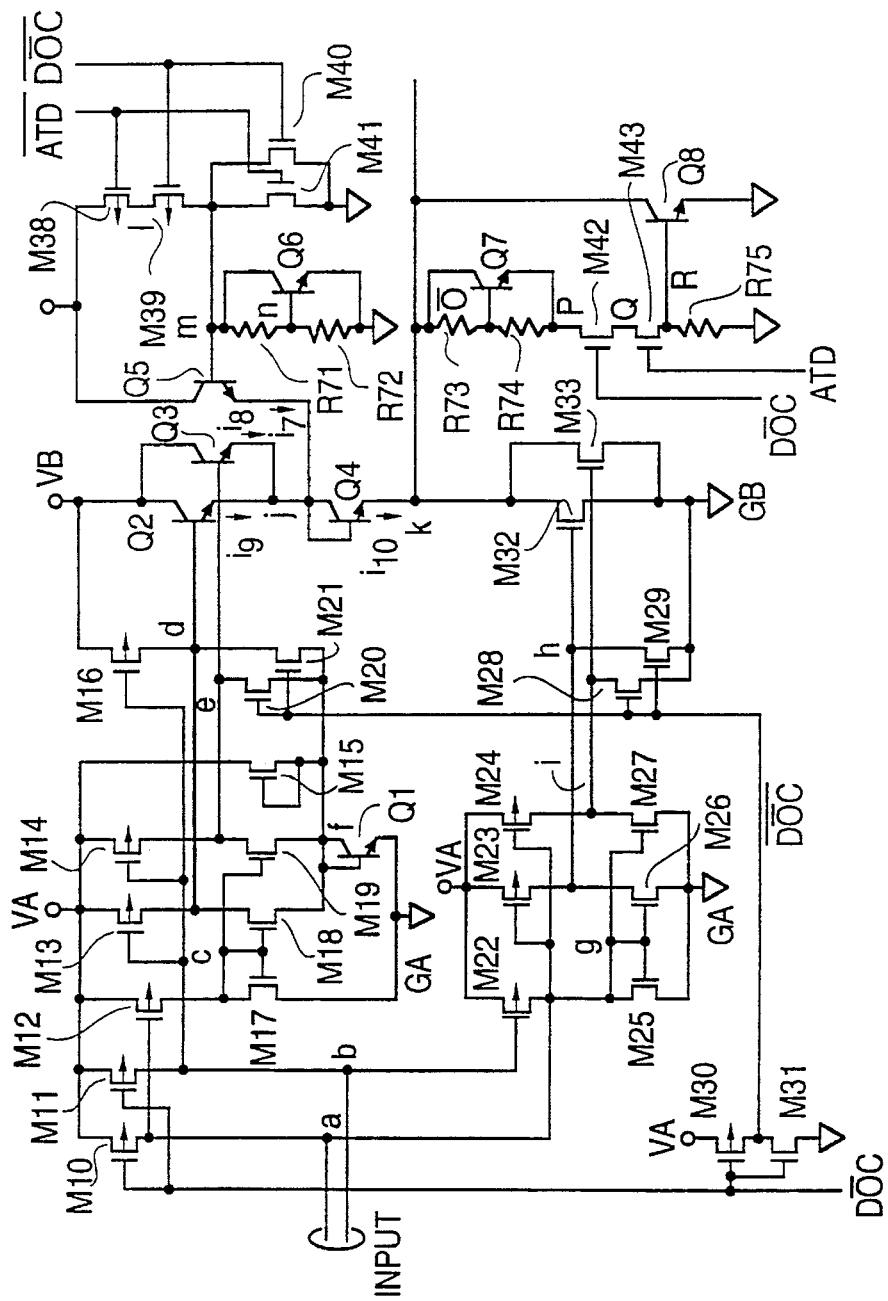
FIGS. 7(a) to 7(c) show another embodiment circuit of the present invention and waveforms of its operations.
Figure 7B:
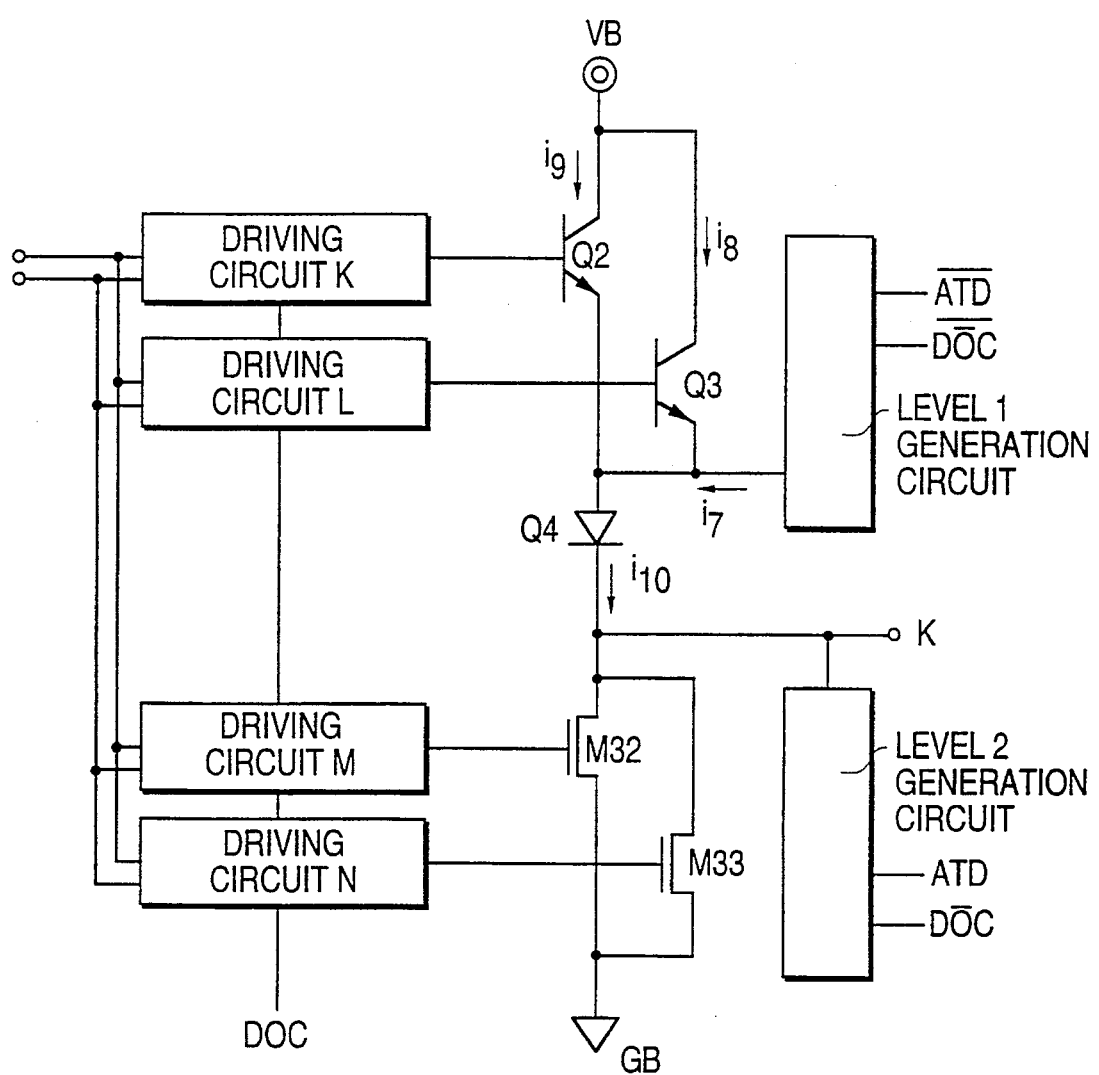
Figure 7C:
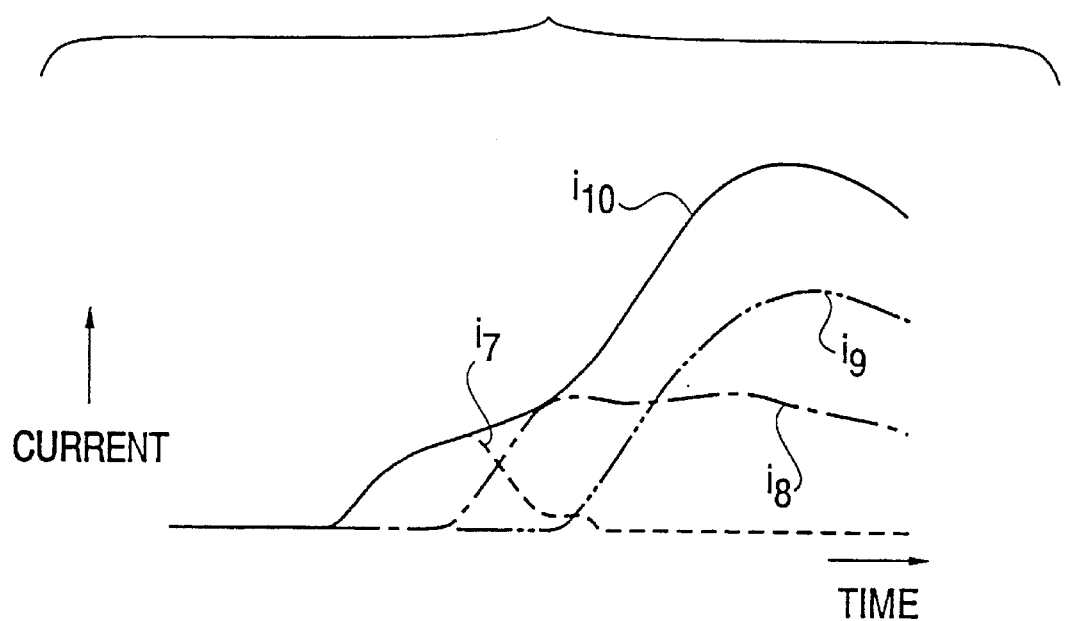
Figure 7C:
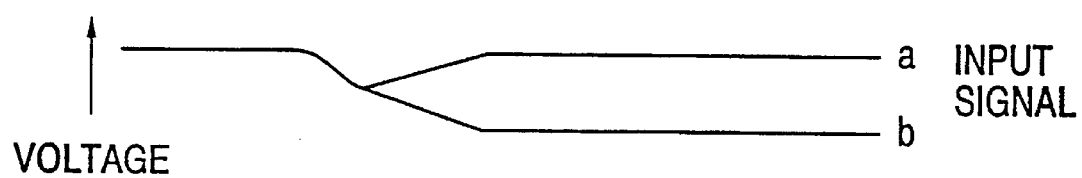
Figure 7C:
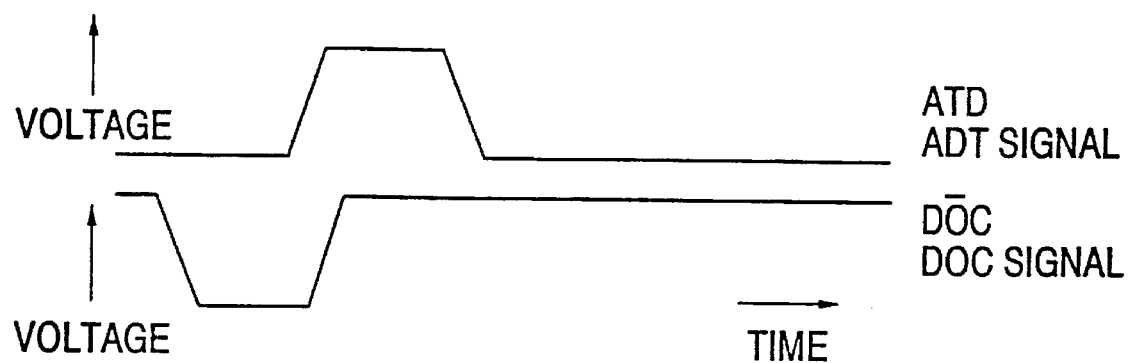

For example, in a typical semiconductor memory, information stored in a memory cell is retrieved selectively according to an address signal inputted, and, through a sense circuit, the information is supplied as an output from an output buffer circuit. By applying an output buffer circuit according to the invention to the above buffer circuit, a low noise and high speed memory is provided. When such an output circuit as shown in FIG. 4 is applied thereto, for example, a high speed operation with an increased speed by 30 to 40% can be achieved. Further, when the output buffer circuit as shown in FIG. 7(a) is applied, about a 50% increase in speed can be achieved. One example of a semiconductor memory in which the present invention can be used is the 16384-Word×4 Bit High Speed Hi-BiCMOS Static RAM manufactured by Hitachi, Ltd. under the chip number HM6789H.

Figure 9:
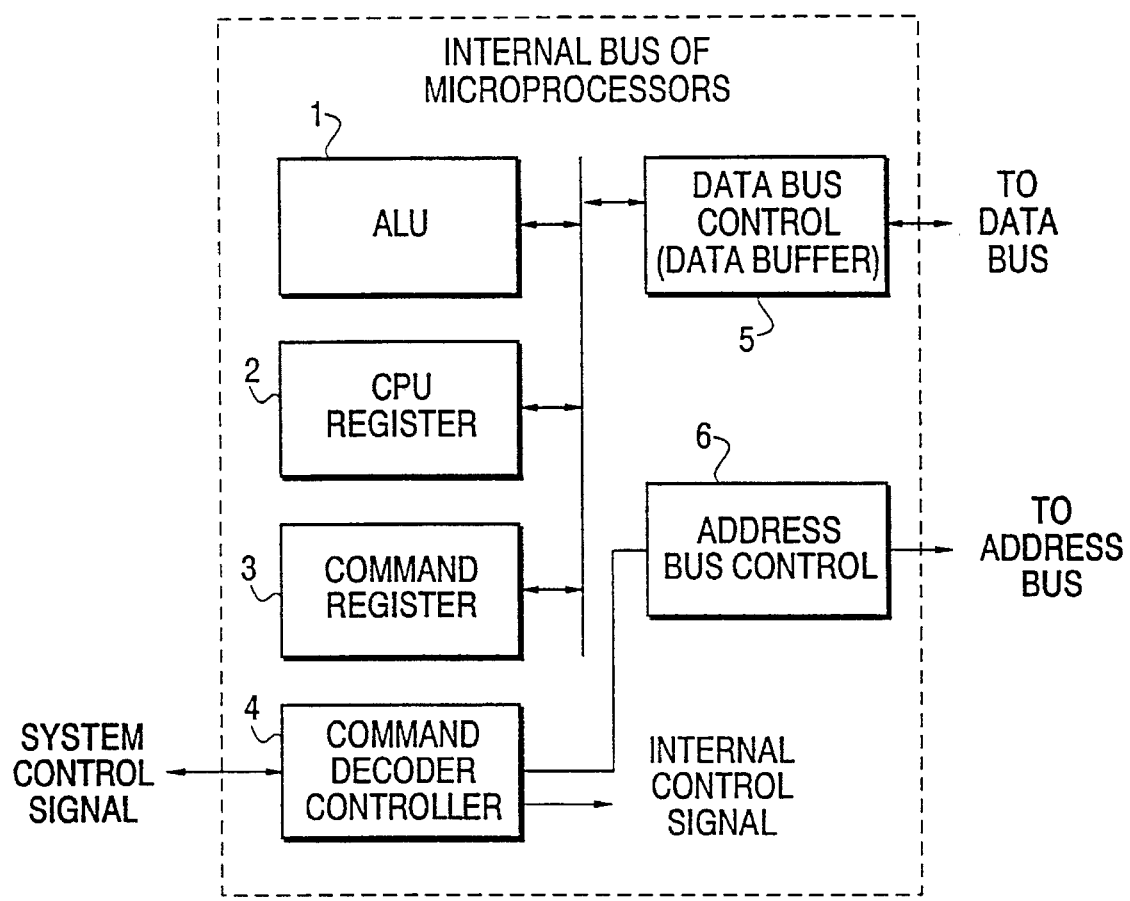
FIG. 9 is moreover another embodiment block diagram of the present invention.

Referring to FIG. 9, an example of application of an output buffer circuit according to the present invention to a microprocessor is explained in the following.

A block diagram explaining the fundamental internal configuration of a microprocessor is shown in FIG. 9.

The internal configuration of a microprocessor consists roughly of an internal bus; a CPU register 2 for loading data; an instruction register 3 for loading instructions; an ALU 1 for conducting arithmetic and logical operations; a data bus control unit (data buffer) 5 for controlling input/output of data between the data bus and the internal bus; a unit 4 consisting of an instruction decoder for decoding instructions and an internal/external control for controlling internal and external circuits; and an address bus control unit 6 coupled between the address bus and the internal/external control unit 4 for controlling the address bus. The buffer circuit according to the present invention is used in the output buffer circuit in the address bus control unit 6, and in part of the data buffer circuit of the data bus control unit 5, and further in the control signal (system control signal or internal control signal) output circuit of the internal/external control unit 4. In other words, it can be applied to every portion wherein means for outputting signals from the LSI chips are involved.

Thereby, the advantage according to the present invention to provide a high speed and low noise signal has been realized in a microprocessor.

Hereinabove, there have been explained examples mainly of the embodiments of the present invention as applied to the output buffer circuits. However, the present invention may be applied to almost every case where switching of a large capacity load at a high speed is concerned.

Figure 10A:
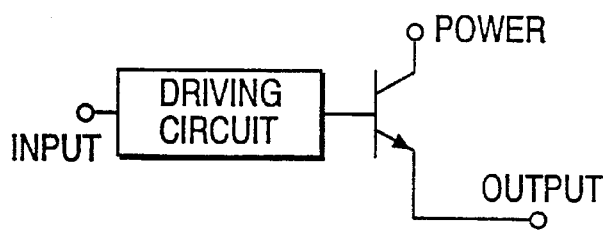
FIGS. 10(a) to 10(e) is another different embodiment of the present invention.
Figure 10B:
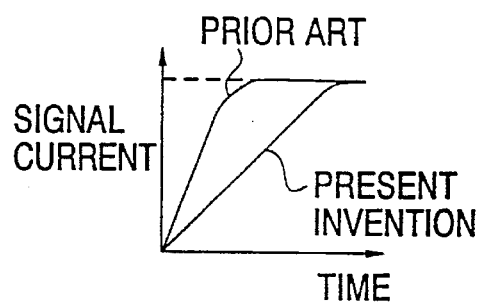

The present invention has been explained hereinabove with reference mainly to the output buffer circuits. Another advantage of the present invention, however, is that it is also possible to provide an optimum control means for controlling bipolar transistors or MOS transistors to be used as output transistors, thereby reducing switching noise in transistors. An example applied to this effect is shown in FIGS. 10(a) and 10(b). In this embodiment, a current inputted to the base of a bipolar transistor rises to a predetermined value stepwise or rather gradually, without showing a steep curve.

Figure 10C:
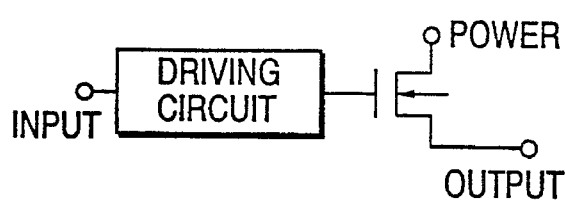
Figure 10D:
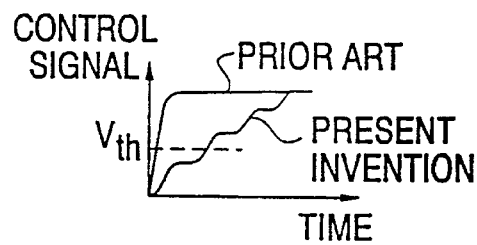
Figure 10E:
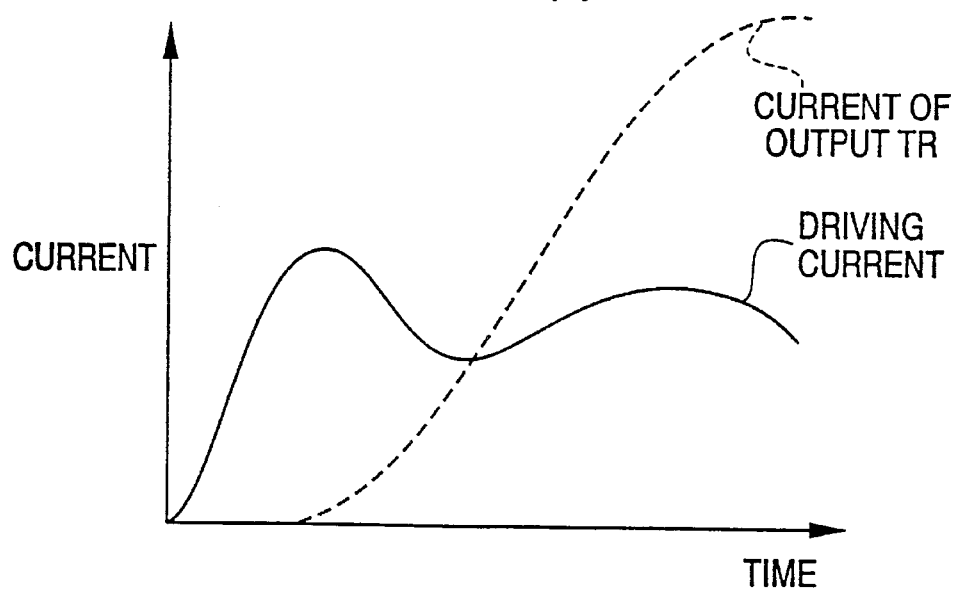

Further, under a constant drive current for an output transistor, by controlling its drive force to decrease during a certain period of time wherein the maximum rate of increase in current is predicted to occur, the rate of increase in current can be reduced (e.g., see FIG. 10(e)), whereby the switching noise is reduced substantially. Also, regarding a gate signal to be applied to the gate of a MOS transistor as shown in FIGS. 10(c) and 10(d), it can be increased to its predetermined value stepwise or more gradually after applying a voltage sufficiently lower than the predetermined value, but higher than the threshold value of the MOS transistor so as to turn on the MOS transistor, whereby the switching noise is reduced substantially.

As is clearly understood from the above descriptions, according to the present invention it is possible to obtain a novel high speed and low noise semiconductor integrated circuit and a novel semiconductor integrated circuit device (for example, a memory device, a microprocessor, etc.) incorporating the same, wherein a smoothed operation in switching is obtained ensuring a high speed circuit operation.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A microprocessor comprising:

an internal bus for transmitting signals;

an arithmetic and logical operation unit, connected to said internal bus, for conducting arithmetic and logical operations;

a data bus control unit, connected to said internal bus, for controlling input/output of data between a data bus and said internal bus;

a CPU register, connected to said internal bus, for loading said data from said data bus control unit;

an instruction register, connected to said internal bus, for loading instruction data from said data bus control unit;

an instruction decoder for decoding instructions;

an internal/external control unit for controlling internal and external circuits; and an address bus control unit coupled between an address bus and said internal/external control unit for controlling the address bus;

wherein at least one of said internal/external control unit for outputting control signals, said data bus control unit for outputting data and said address bus control unit includes an output data buffer having a circuit for charging and discharging an external load comprising:

a plurality of output transistors coupled in parallel with each other, one end of each transistor being coupled to a power supply terminal or to a ground terminal, and another end of each transistor being coupled to the external load through an output terminal, wherein said plurality of output transistors forms an output buffer circuit coupled to an input terminal through driving circuits, and wherein at least one of said plurality of output transistors has characteristics different from characteristics of the other output transistors of said plurality of output transistors wherein starting times of said at least one of said output transistors will be different from starting times of said other output transistors during both charging and discharging operations of said external load.

2. A microprocessor comprising:

an internal bus for transmitting signals;

an arithmetic and logical operation unit, connected to said internal bus, for conducting arithmetic and logical operations;

a data bus control unit, connected to said internal bus, for controlling input/output of data between a data bus and said internal bus;

a CPU register, connected to said internal bus, for loading said data from said data bus control unit;

an instruction register, connected to said internal bus, for loading instruction data from said data bus control unit;

an instruction decoder for decoding instructions;

an internal/external control unit for controlling internal and external circuits; and an address bus control unit coupled between an address bus and said internal/external control unit for controlling the address bus;

wherein at least one of said internal/external control unit for outputting control signals, said data bus control unit for outputting data and said address bus control unit includes an output data buffer having a circuit for charging and discharging an external load comprising:

a plurality of output transistors coupled in parallel with each other, one end of each transistor being coupled to a power supply terminal or to a ground terminal, and another end of each transistor being coupled to the external load through an output terminal, wherein said plurality of output transistors form an output buffer circuit coupled to an input terminal through driving circuits which control on/off switching of said plurality of output transistors, wherein at least one of said plurality of output transistors has characteristics different from characteristics of the other output transistors of said plurality of output transistors so that starting times of said at least one of said output transistors will be different from starting times of said other output transistors during both charging and discharging operations of said external load, and wherein at least one of said driving circuits has a driving capacity different from driving capacities of the other driving circuits wherein starting times of an output transistor coupled to said at least one of said driving circuits will be different from starting times of the other output transistors during both charging and discharging operations of said external load.

3. A microprocessor according to claim 2, wherein said at least one of said plurality of output transistors has a smaller size than a size of the other output transistors of said plurality of output transistors.

4. A microprocessor according to claim 3, wherein said at least one of said driving circuits has a larger driving capacity than driving capacities of the other driving circuits.

5. A microprocessor according to claim 2, wherein said at least one of said plurality of output transistors has a faster switching speed than switching speeds of the other output transistors of said plurality of output transistors.

6. A microprocessor according to claim 3, wherein said at least one of said driving circuits has a faster signal transmission speed than signal transmission speeds of the other driving circuits.

7. A microprocessor comprising:

an internal bus for transmitting signals;

an arithmetic and logical operation unit, connected to said internal bus, for conducting arithmetic and logical operations;

a data bus control unit, connected to said internal bus, for controlling input/output of data between a data bus and said internal bus;

a CPU register, connected to said internal bus, for loading said data from said data bus control unit;

an instruction register, connected to said internal bus, for loading instruction data from said data bus control unit;

an instruction decoder for decoding instructions;

an internal/external control unit for controlling internal and external circuits; and an address bus control unit coupled between an address bus and said internal/external control unit for controlling the address bus;

wherein at least one of said internal/external control unit for outputting control signals, said data bus control unit for outputting data and said address bus control unit includes an output data buffer having a circuit for charging and discharging an external load comprising:

a first plurality of output transistors coupled in parallel to one another, each having one end coupled to a power supply terminal through a first common joining node and another end coupled to the external load through a second common joining node; and a second plurality of output transistors coupled in parallel to one another and disposed between said second common joining node and a ground terminal, wherein each of said first plurality of output transistors includes a control terminal coupled with a control terminal of one of said second plurality of output transistors through a third common joining node, said each control terminal being further connected to one end of respective driving circuits through the third common joining node, and further wherein other ends of said plurality of driving circuits are coupled to an internal circuit through a fourth common joining node, and wherein at least one of said first plurality of output transistors has characteristics different from characteristics of the other transistors of said first plurality of output transistors wherein starting times of said at least one of said first plurality of output transistors will be different from starting times of the other transistors of said first plurality of output transistors during both charging and discharging operations of said external load, and wherein at least one of said second plurality of output transistors has characteristics different from characteristics of the other transistors of said second plurality of output transistors wherein starting times of said at least one of said second plurality of output transistors will be different from starting times of the other transistors of said second plurality of output transistors during both charging and discharging operations of said external load.

8. A microprocessor according to claim 7, wherein at least one output transistor out of said first plurality of output transistors and at least one output transistor out of said second plurality of output transistors have smaller sizes than other output transistors of said first plurality of output transistors and said second plurality of output transistors, respectively.

9. A microprocessor comprising:

an internal bus for transmitting signals;

an arithmetic and logical operation unit, connected to said internal bus, for conducting arithmetic and logical operations;

a data bus control unit, connected to said internal bus, for controlling input/output of data between a data bus and said internal bus;

a CPU register, connected to said internal bus, for loading said data from said data bus control unit;

an instruction register, connected to said internal bus, for loading instruction data from said data bus control unit;

an instruction decoder for decoding instructions;

an internal/external control unit for controlling internal and external circuits; and an address bus control unit coupled between an address bus and said internal/external control unit for controlling the address bus;

wherein at least one of said internal/external control unit for outputting control signals, said data bus control unit for outputting data and said address bus control unit includes an output data buffer having a circuit for charging and discharging an external load comprising:

at least two bipolar transistors coupled in parallel, collectors of said bipolar transistors being coupled to a power supply terminal through a common joining node, emitters of the bipolar transistors being coupled to the external load through an output terminal through another common joining node and a diode, and each base part of the bipolar transistors being coupled to a driving circuit, respectively; and at least two MOS transistors coupled in parallel, drain of said MOS transistors being coupled to said output terminal through a common joining node, sources of the MOS transistors being connected to a ground terminal through another common joining node, and gates of the MOS transistor being coupled to driving circuits, said driving circuits also being coupled to an input terminal, wherein at least one of said bipolar transistors has a smaller size than the other bipolar transistors, and at least one of said MOS transistors has a smaller size than the other MOS transistors wherein the starting times of said at least one of said bipolar transistors will be different from starting times of the other bipolar transistors during both charging and discharging operations of said external load, and wherein starting times of said at least one of said MOS transistors will be different from starting times of the other MOS transistors during both charging and discharging operations of said external load.

10. A microprocessor according to claim 9, further comprising means for supplying a presetting current to an emitter terminal of at least one of said bipolar transistors before a bipolar transistor start operation.

11. A microprocessor according to claim 9, further comprising means for draining a current from said output terminal before a bipolar transistor start operation.

12. A microprocessor according to claim 2, wherein said at least one of said plurality of output transistors has a lower threshold voltage than a threshold voltage of the other output transistors.

13. A microprocessor according to claim 4, wherein said plurality of output transistors are bipolar transistors, and further wherein said at least one of said plurality of output transistors has a smaller emitter area than an emitter area of the other output transistors.

14. A microprocessor according to claim 4, wherein said plurality of output transistors are bipolar transistors, and further wherein said at least one of said plurality of output transistors has a smaller base thickness than a base thickness of the other output transistors.

15. A microprocessor according to claim 4, wherein said plurality of output transistors are bipolar transistors, and further wherein said at least one of said plurality of output transistors has a smaller epitaxial layer thickness than an epitaxial layer thickness of the other output transistors.

16. A microprocessor according to claim 4, wherein said plurality of output transistors are field effect transistors, and further wherein said at least one of said plurality of output transistors has a smaller gate oxide thickness than a gate oxide thickness of the other output transistors.

17. A microprocessor according to claim 4, wherein said plurality of output transistors are field effect transistors, and further wherein said at least one of said plurality of output transistors has a shorter gate length than a gate length of the other output transistors.

18. A microprocessor according to claim 3, wherein said driving circuits include field effect transistors, and further wherein said at least one of said driving circuits includes a field effect transistor having an increased gate width relative to a gate width of the other field effect transistors.

19. A microprocessor comprising:

an internal bus for transmitting signals;

an arithmetic and logical operation unit, connected to said internal bus, for conducting arithmetic and logical operations;

a data bus control unit, connected to said internal bus, for controlling input/output of data between a data bus and said internal bus;

a CPU register, connected to said internal bus, for loading said data from said data bus control unit;

an instruction register, connected to said internal bus, for loading instruction data from said data bus control unit;

an instruction decoder for decoding instructions;

an internal/external control unit for controlling internal and external circuits; and an address bus control unit coupled between an address bus and said internal/external control unit for controlling the address bus;

wherein at least one of said internal/external control unit for outputting control signals, said data bus control unit for outputting data and said address bus control unit includes an output data buffer having a circuit for charging and discharging an external load comprising:

a first pair of output transistors coupled in parallel with one another between a first power supply terminal and the output node;

a second pair of output transistors coupled in parallel with one another between a second power supply terminal and said output node;

a first driving means coupled between an input terminal and respective control terminals of said first pair of output transistors;

a second driving means coupled between said input terminal and respective control terminals of said second pair of output transistors; and a two-level preset means coupled to said output node, including means for increasing a voltage of the output node to a predetermined first level prior to an input signal being provided to said input terminals when the voltage level of the output node is at a predetermined low level, and further including means for decreasing the voltage of the output node to a predetermined second level prior to an input signal being provided to said input terminal when the voltage level of the output node is at a predetermined high level, wherein said first pair of output transistors have characteristics different from one another wherein starting times of said first pair of transistors will be different from one another during both charging and discharging operations of said external load, and wherein said second pair of transistors have characteristics different from one another wherein starting times of said second pair of transistors will be different from one another during both charging and discharging operations of said external load.

20. A microprocessor according to claim 19, wherein said semiconductor integrated circuit is a semiconductor memory circuit for receiving an address signal, and wherein said two-level preset means is responsive to an address transition detection means which detects changes in said address signals.

21. A microprocessor according to claim 20, wherein said two-level preset means is also responsive to a logical combination of a chip select signal, a write enable signal and an operation enable signal applied to said semiconductor memory circuit.

22. A microprocessor according to claim 19, wherein said first and second pairs of output transistors are comprised of field effect transistors.

23. A microprocessor according to claim 19, wherein said first pair of output transistors is formed of bipolar transistors, and wherein said second pair of output transistors is formed of field effect transistors.

24. A microprocessor according to claim 19, wherein said first driving means comprises a first driving circuit coupled to one of the transistors of the first pair of output transistors and a second driving circuit coupled to the other transistor of the first pair of output transistors, and wherein the second driving means includes a third driving circuit coupled to one of the transistors of the second pair of output transistors and a fourth driving circuit coupled to the other transistor of the second pair of output transistors.

25. A microprocessor according to claim 24, wherein the transistors of the first pair of output transistors have characteristics different from one another, and wherein the transistors of the second pair of output transistors have characteristics different from one another.

26. A microprocessor according to claim 24, wherein at least one of the first, second, third and fourth driving circuits has driving characteristics different from driving characteristics of the other driving circuits.

27. A microprocessor according to claim 24, wherein predetermined characteristics of the transistors of the first and second pairs of output transistors are arranged so that one of the transistors of the first pair of output transistors will turn on before the other transistor of the first pair of output transistors, and one of the transistors of the second pair of output transistors will turn on before the other transistor of the second pair of output transistors.

28. A microprocessor according to claim 24, wherein predetermined driving characteristics of the first, second, third and fourth driving circuits are arranged so that one of the transistors of the first pair of output transistors will turn on before the other transistor of the first pair of output transistors, and one of the transistors of the second pair of output transistors will turn on before the other transistor of the second pair of output transistors.

* * * * *